(12) United States Patent
Hill

(10) Patent No.: US 7,846,812 B2
(45) Date of Patent: Dec. 7, 2010

(54) METHODS OF FORMING TRENCH ISOLATION AND METHODS OF FORMING FLOATING GATE TRANSISTORS

(75) Inventor: Christopher W. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 70 days.

(21) Appl. No.: 11/958,551

(22) Filed: Dec. 18, 2007

(65) Prior Publication Data

US 2009/0155980 A1 Jun. 18, 2009

(51) Int. Cl.
*H01L 21/76* (2006.01)
*H01L 21/336* (2006.01)
*H01L 21/302* (2006.01)
*H01L 21/461* (2006.01)
*H01L 21/033* (2006.01)

(52) U.S. Cl. .................. 438/424; 438/257; 438/301; 438/717; 257/E21.039

(58) Field of Classification Search ................. 438/257, 438/301, 424, 717
See application file for complete search history.

(56) References Cited

U.S. PATENT DOCUMENTS

| | | | |
|---|---|---|---|
| 5,328,810 A | 7/1994 | Lowrey et al. | |
| 6,118,167 A | 9/2000 | DiSimone et al. | |
| 6,180,466 B1 | 1/2001 | Ibok | |
| 6,221,733 B1 | 4/2001 | Li et al. | |
| 6,355,524 B1 * | 3/2002 | Tuan et al. | 438/257 |
| 6,740,933 B2 | 5/2004 | Yoo et al. | |
| 6,764,922 B2 | 7/2004 | Beyer et al. | |
| 6,919,260 B1 | 7/2005 | Umezawa et al. | |
| 7,112,849 B2 | 9/2006 | Ahn et al. | |
| 7,229,896 B2 | 6/2007 | Chen et al. | |
| 2001/0021567 A1 | 9/2001 | Takahashi | |
| 2003/0006475 A1 * | 1/2003 | Tseng | 257/510 |
| 2003/0054608 A1 * | 3/2003 | Tseng et al. | 438/257 |
| 2003/0209760 A1 | 11/2003 | Maruyama | |

(Continued)

FOREIGN PATENT DOCUMENTS

EP 1 775 771 A2 4/2007

(Continued)

OTHER PUBLICATIONS

Ikeda et al., *Mechanical Stress Control in a VLSI-Fabrication Process: A Method for Obtaining the Relation . . .*, IEEE Transactions on Semiconductor Manufacturing, vol. 16, No. 4, pp. 696-703 (Nov. 2003).

(Continued)

*Primary Examiner*—Savitri Mulpuri
*Assistant Examiner*—Calvin Choi
(74) *Attorney, Agent, or Firm*—Wells St. John P.S.

(57) ABSTRACT

A method of forming trench isolation includes etching first trench lines into semiconductive material of a semiconductor substrate. First isolation material is formed within the first trench lines within the semiconductive material. After forming the first isolation material within the first trench lines, second trench lines are etched into semiconductive material of the substrate between the first trench lines such that the first trench lines and second trench lines alternate. Second isolation material is formed within the second trench lines within the semiconductive material. Alternate and additional aspects are contemplated.

18 Claims, 16 Drawing Sheets

U.S. PATENT DOCUMENTS

| | | |
|---|---|---|
| 2004/0038495 A1 | 2/2004 | Wieczorek et al. |
| 2004/0178450 A1 | 9/2004 | Lee et al. |
| 2005/0277257 A1 | 12/2005 | Byun et al. |
| 2006/0046407 A1* | 3/2006 | Juengling .................. 438/301 |
| 2006/0046422 A1 | 3/2006 | Tran et al. |
| 2006/0068542 A1 | 3/2006 | Orlowski et al. |
| 2006/0264003 A1 | 11/2006 | Eun |
| 2006/0286750 A1 | 12/2006 | Fang et al. |
| 2007/0049011 A1 | 3/2007 | Tran |
| 2007/0117310 A1 | 5/2007 | Bai et al. |
| 2007/0148984 A1 | 6/2007 | Abatchev et al. |
| 2007/0161207 A1 | 7/2007 | Park |
| 2007/0161251 A1 | 7/2007 | Tran et al. |
| 2007/0178664 A1 | 8/2007 | Tseng et al. |
| 2007/0221950 A1 | 9/2007 | Suzuki et al. |
| 2007/0238260 A1 | 10/2007 | Yang |
| 2007/0238299 A1 | 10/2007 | Niroomand et al. |
| 2007/0252175 A1 | 11/2007 | Tang et al. |

FOREIGN PATENT DOCUMENTS

| | | |
|---|---|---|
| JP | 2004363121 A | 12/2004 |
| JP | 2007073985 A | 3/2007 |
| KR | 2001-0030009 | 4/2001 |
| KR | 2002-0022120 A | 3/2002 |
| KR | 10-2005-0014164 A | 2/2005 |
| TW | 379412 B | 1/2000 |
| TW | 247377 B | 1/2006 |
| TW | 265589 B | 11/2006 |

OTHER PUBLICATIONS

Kim et al., *High-Density Trench DMOSFETs Employing Two Step Trench Technique and Trench Contact . . .* , IEEE 15th International Symposium on Power Semiconductor Devices and ICs, pp. 165-168 (Apr. 2003).

Park et al., *A Novel Shallow Trench Isolation Technology Using LPCVD/SiN Liner in SOI Wafer*, IEEE International SOI Conference, pp. 83-84 (2001).

\* cited by examiner

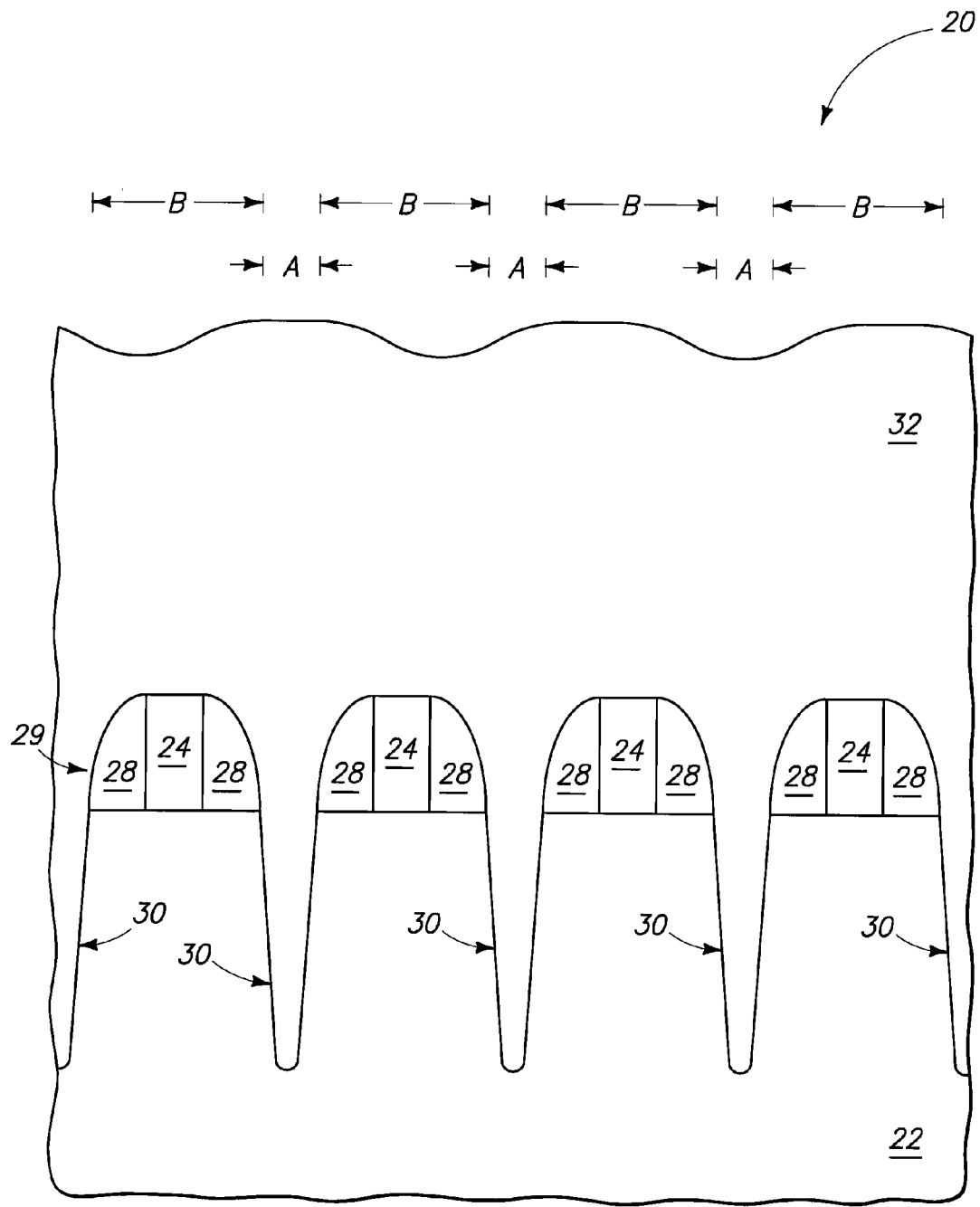
F I G 7

METHODS OF FORMING TRENCH ISOLATION AND METHODS OF FORMING FLOATING GATE TRANSISTORS

TECHNICAL FIELD

Embodiments disclosed herein pertain to methods of forming trench isolation and to methods of forming floating gate transistors.

BACKGROUND

In the fabrication of integrated circuitry, numerous devices are packed into a small area of a semiconductor substrate to create an integrated circuit. Many of the individual devices are electrically isolated from one another. Accordingly, electrical isolation is an integral part of semiconductor device design for preventing unwanted electrical coupling between adjacent components and devices.

As the size of integrated circuits is reduced, the devices that make up the circuits are positioned closer together. One method of isolating circuit components is trench isolation. Such occurs by etching trenches into semiconductive material of a substrate and filling the trenches with a suitable electrical isolation material, typically insulative material although other materials such as a semiconductive material to which a potential can be applied might also be used. As the density of components on the semiconductor substrate has increased, the widths of the trenches have decreased. Further, the depths of the trenches have tended to increase.

The continual reduction in device or feature sizes places ever greater demands on the techniques used to form the features, such as isolation trenches and the active or circuitry area there-between. For example, photolithography is commonly used to pattern the features. A concept commonly referred to as "pitch" can be used to describe the size of repeating features, such as a series of trench lines. Pitch is defined as the distance between an identical point in two neighboring features. In the context of isolation trenches, the trench is essentially defined by the cross-sectional dimension of the trench and the immediately adjacent space between two adjacent trenches. As a result, pitch can be viewed as the sum of the width of the trench and the width of the space on one side of the trench separating that trench from a neighboring trench. However, due to factors such as optics and light or radiation wave length, photolithography techniques have a minimum pitch below which a particular photolithographic technique cannot reliable form features. Thus, the minimum pitch of a photolithographic technique is an obstacle to continued feature size reduction.

"Pitch doubling" or "pitch multiplication" are techniques proposed for extending the capabilities of photolithographic process beyond their minimum pitch. Such techniques typically fabricate features in a mask to a minimum capable dimension using photolithography. Then, the widths of the mask features are expanded, for example by sidewall oxidation or deposition and anisotropic etch to form spacers such that the width increase on at least one side of the feature is of a dimension less than the minimum photolithographic feature resolution. The original mask features are then etched selectively relative to the added material, thus leaving a mask having feature widths which are less than that which can be achieved using photolithography alone.

A particular problem which motivated some embodiments of the invention is described with reference to FIG. 1. Such depicts a semiconductor substrate 10 comprising bulk semiconductive material 11 having a mask 12 that has been formed thereover. Mask 12 comprises, in the depicted cross-section, parallel feature lines 13 comprised of a first masking material 14 received over a second masking material 15 which is received on semiconductor substrate 11. An example material 15 is pad oxide, while an example material 14 is silicon nitride. Mask 12 has been utilized to form isolation trenches 16 within bulk semiconductor material 11. Silicon dioxide 17, as an isolation material, has been deposited over mask 12 to within isolation trenches 16. Unfortunately as shown, some of the features 13 of mask 12 have toppled or leaned laterally in the direction of the isolation trenches. This occurred during the fill of trenches 16 with material 17 likely due to stresses introduced during the fill. This can also lead to severe bending of the isolation structures and/or including the material 11 immediately beneath mask 12, for example as shown. This particular problem was found to manifest as the width of the isolation trenches or the width of the material between the isolation trenches fell to 35 nanometers and below. Such might occur regardless of whether pitch multiplication techniques are used.

BRIEF DESCRIPTION OF THE DRAWINGS

FIG. 7 is a view of the FIG. 2 substrate fragment after processing subsequent to that shown by FIG. 6.

DETAILED DESCRIPTION OF EXAMPLE EMBODIMENTS

Figure 1:
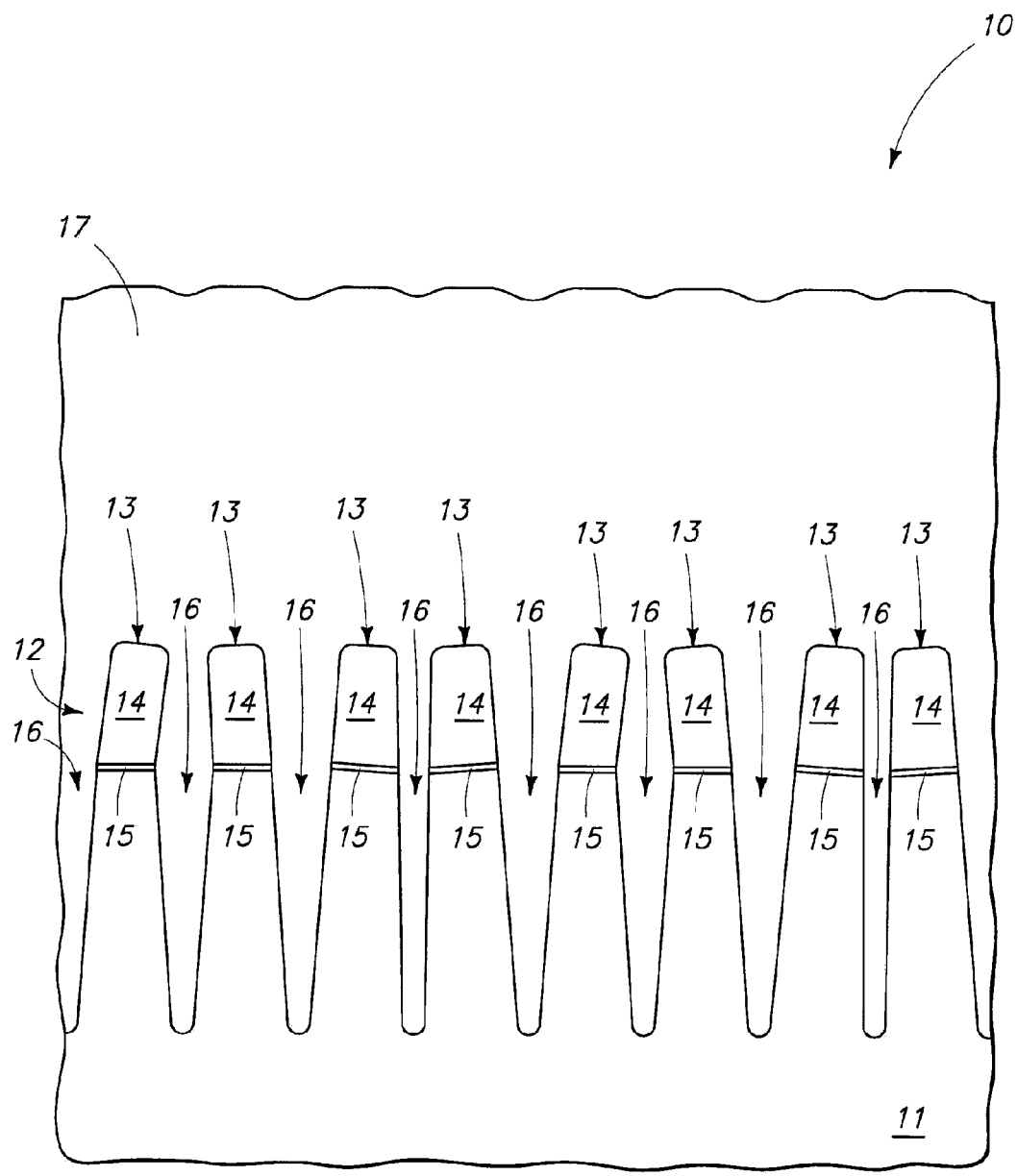
FIG. 1 is a diagrammatic sectional view of a prior art semiconductor substrate fragment.
Figure 2:
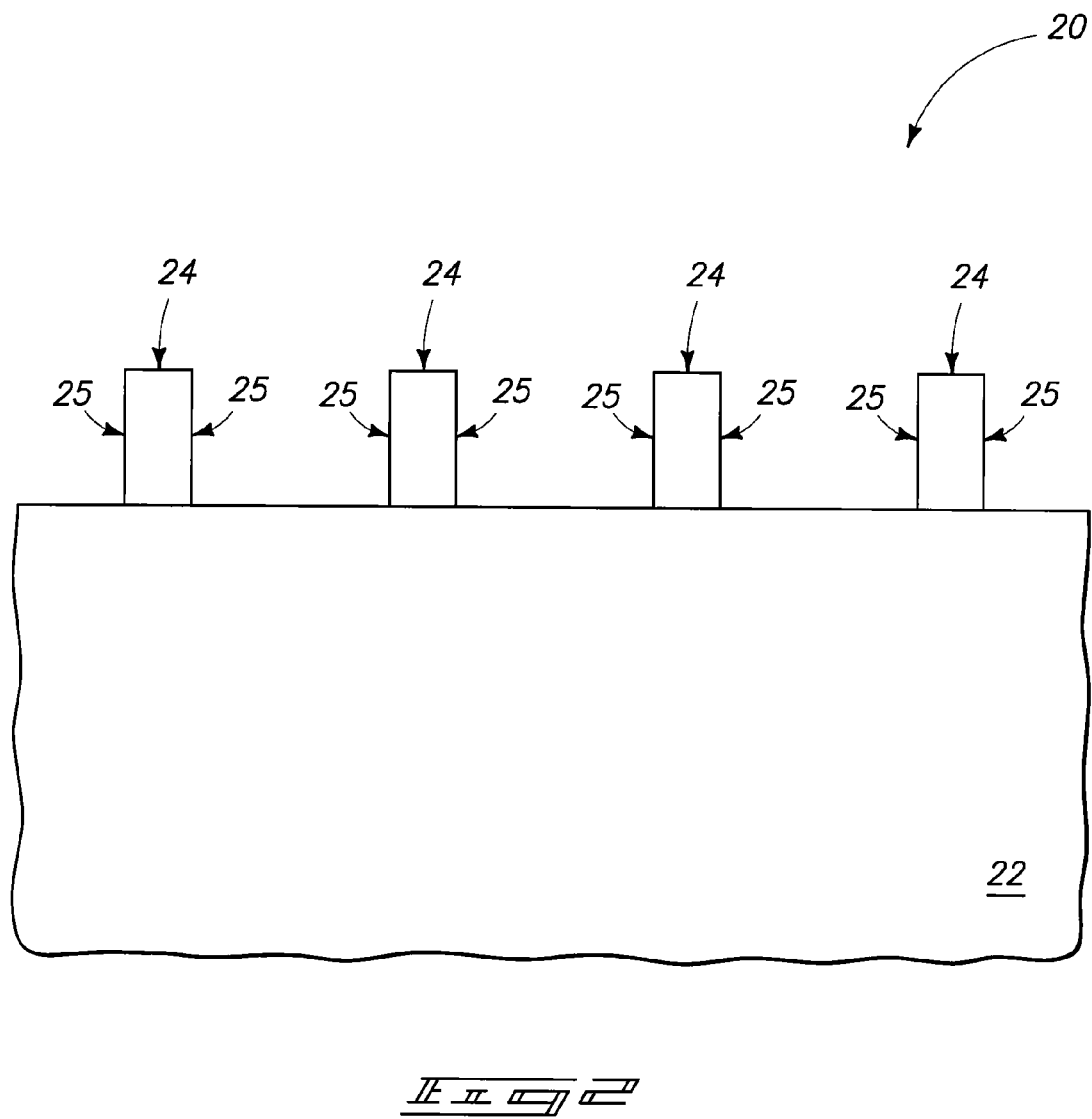
FIG. 2 is a diagrammatic sectional view of a semiconductor substrate fragment in process in accordance with an embodiment of the invention.
Figure 3:
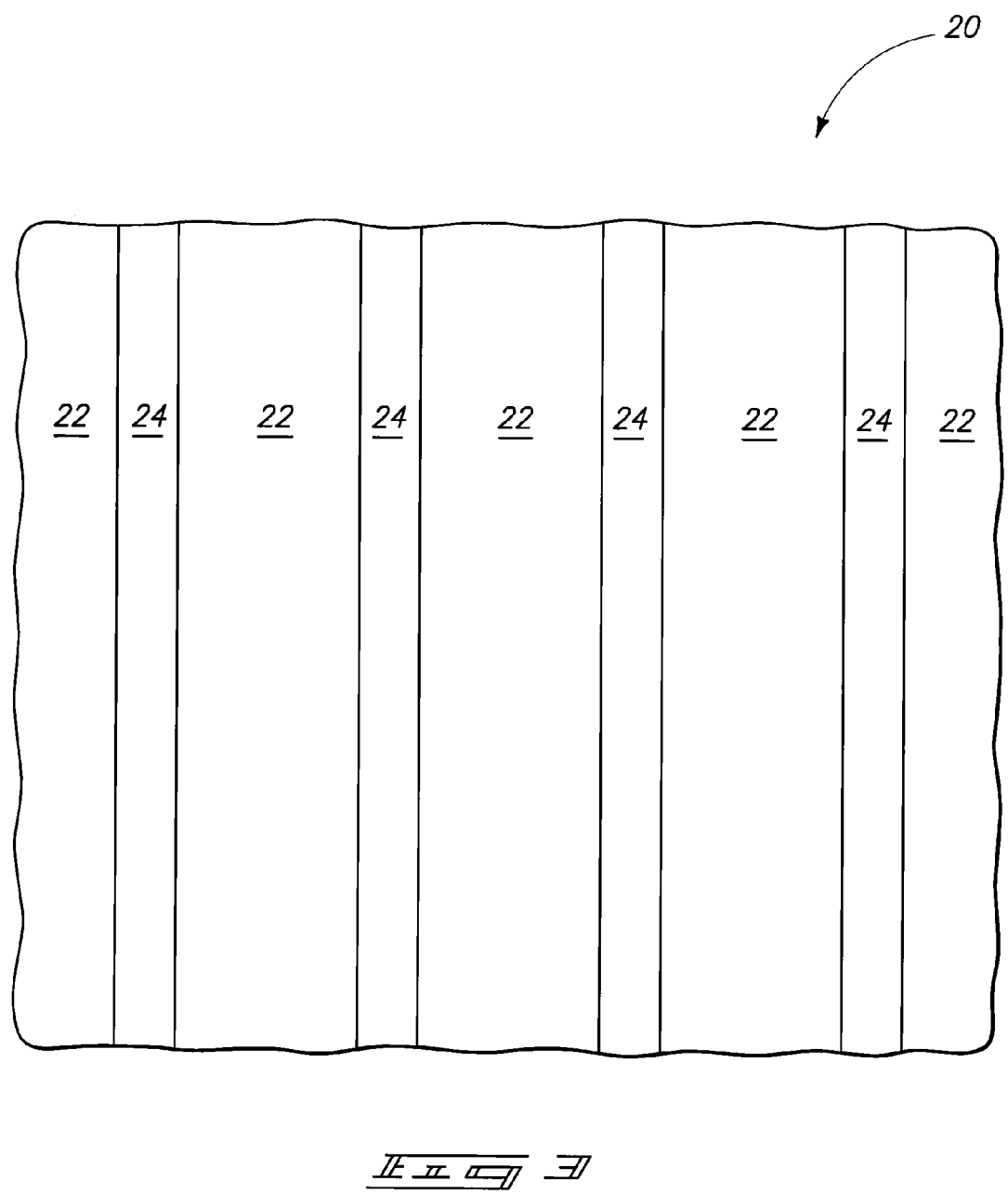
FIG. 3 is a top view of the FIG. 2 substrate fragment.

Referring to FIGS. 2 and 3, a semiconductor substrate in process in accordance with one or more embodiments of the invention is indicated generally with reference numeral 20. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Semiconductor substrate 20 comprises a base or bulk substrate 22 within which isolation trenches will be formed. In one embodiment, such comprises bulk monocrystalline semiconductive material, such as silicon alone or in combination with other material, although semiconductor-on-insulator and other substrates whether existing or yet-to-be developed are also contemplated.

Mask lines 24 have been formed over semiconductor substrate 22. In one embodiment, such are of a material different than that of at least one or more portions of substrate 22 such that material 22 and material 24 are selectively etchable relative to one another. In the context of this document, a material is selectively etchable relative to another if the one can be removed at a rate of at least 1.25 removal rate of the other for some set of etching conditions. Where substrate material 22 comprises monocrystalline silicon, an example material 24 is silicon nitride. Material 24 might also of course comprise multiple different materials and/or regions. For example and by way of example only, a pad oxide layer (not shown) might be received immediately atop substrate material 22 as part of mask lines 24. For purposes of the continuing discussion, mask lines 24 can be considered as comprising sidewalls 25.

Figure 4:
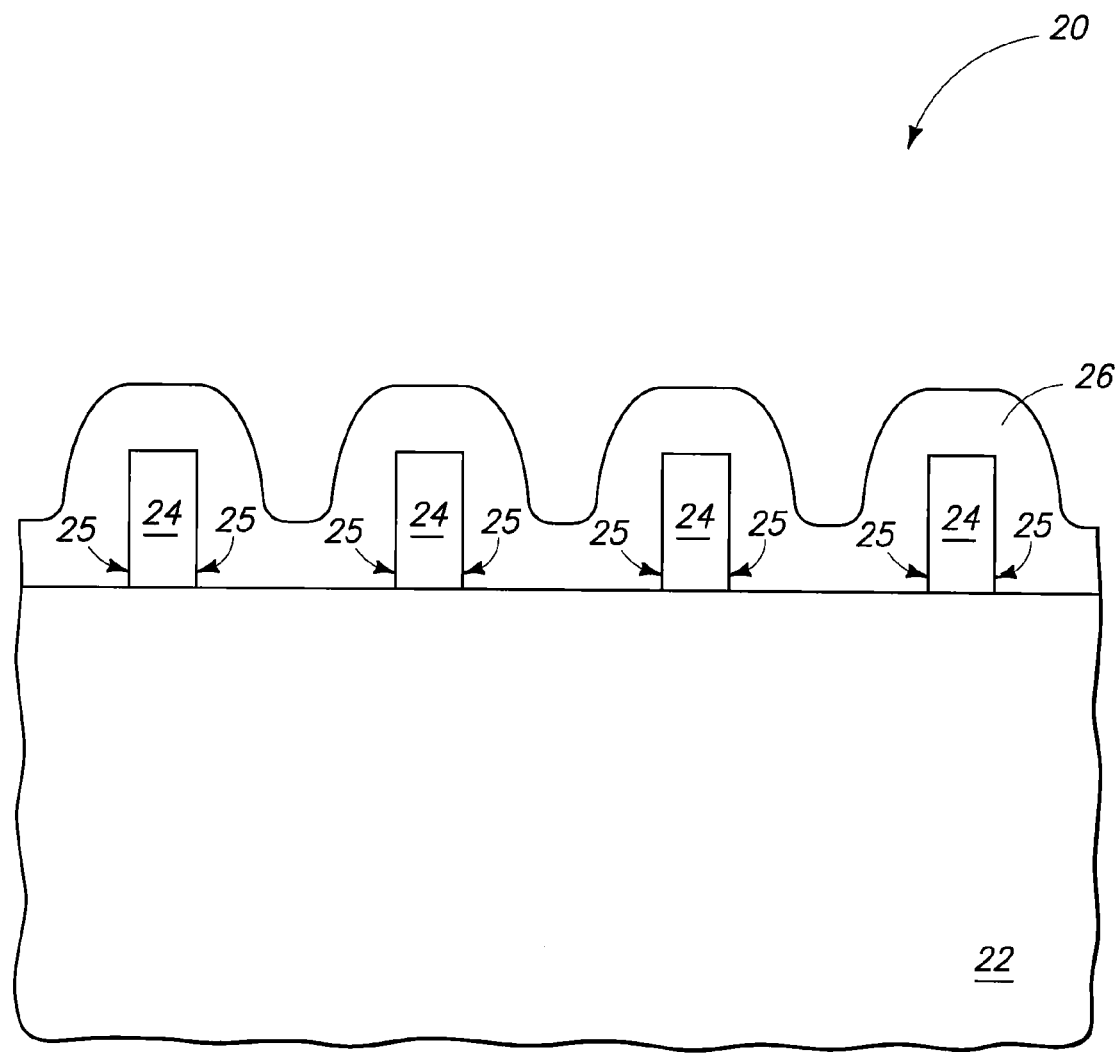
FIG. 4 is a view of the FIG. 2 substrate fragment after processing subsequent to that shown by FIG. 2.

Referring to FIG. 4, a layer 26 has been deposited over substrate 22/24 to a thickness which less than completely fills the spaces between mask lines 24. Material 26 might comprise one or more materials, and in one embodiment is selected such that materials 22, 24, and 26 can be etched selectively relative to each other. In one embodiment where for example material 22 comprises monocrystalline silicon and material 24 comprises silicon nitride or photoresist, an example material 26 is doped or undoped silicon dioxide.

Figure 5:
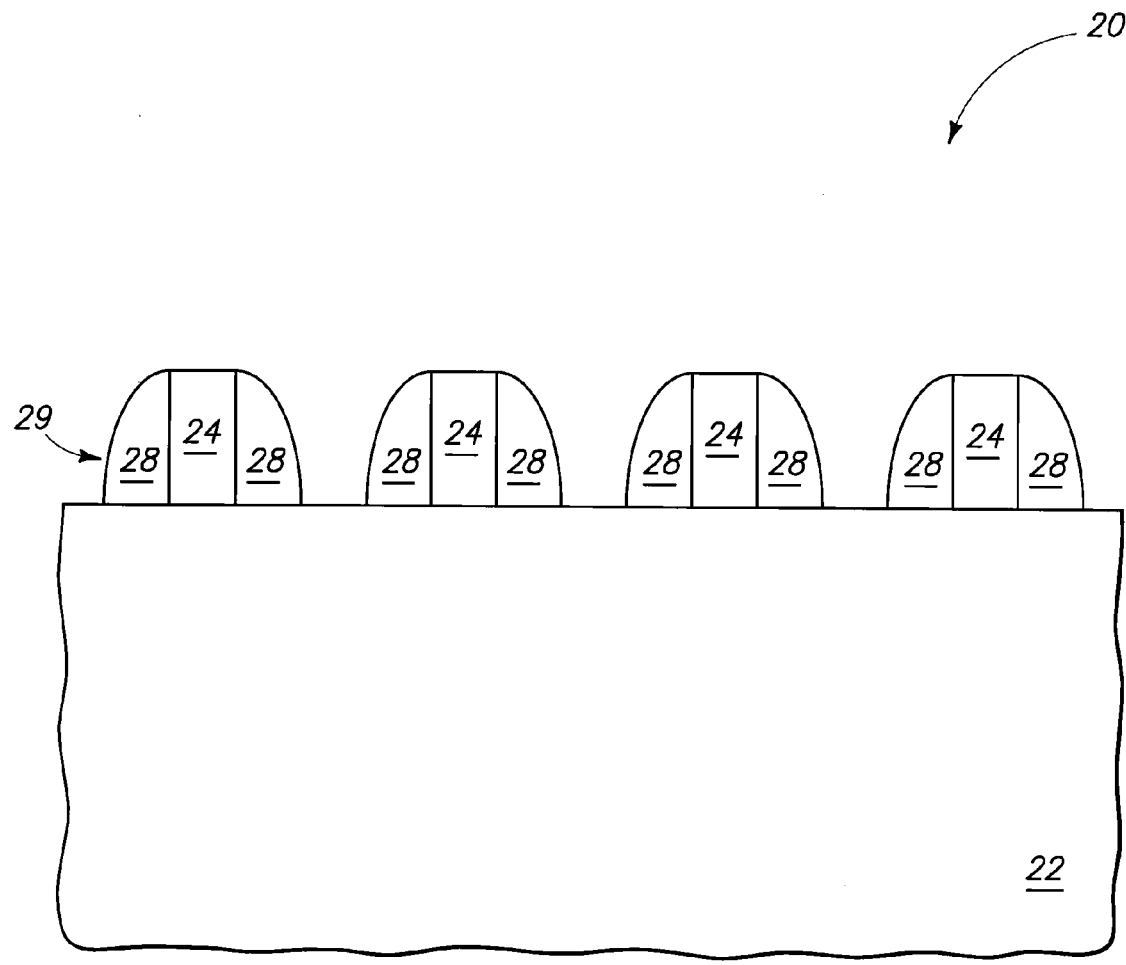
FIG. 5 is a view of the FIG. 2 substrate fragment after processing subsequent to that shown by FIG. 4.

Referring to FIG. 5, material 26 has been etched anisotropically effective to form sidewall spacers 28 there-from on sidewalls 25 of mask lines 24. Such depicts and describes, in but one embodiment, a method of forming mask lines, and forming sidewall spacers on sidewalls of the mask lines, over a semiconductor substrate. Any existing or yet-to-be developed alternate technique might also be utilized in an embodiment of the invention. For example and by way of example only, techniques might be utilized whereby sidewalls of mask lines are oxidized of from sidewall spacers. Regardless in but one example embodiment, FIG. 5 can be considered as depicting a first etching mask 29 comprising mask lines 24 and sidewall spacers 28. Further, in one embodiment, FIG. 5 can be considered as depicting sidewall spacers being formed laterally over sidewalls of the mask lines. The sidewall spacers respectively have a first sidewall spacer edge in physical touching contact with one of the sidewalls of the mask lines. The sidewall spacers respectively have second sidewall spacer edge opposite the first sidewall spacer edge, with the second sidewall spacer edge not being in physical touching contact with any sidewall of the mask lines.

Figure 6:
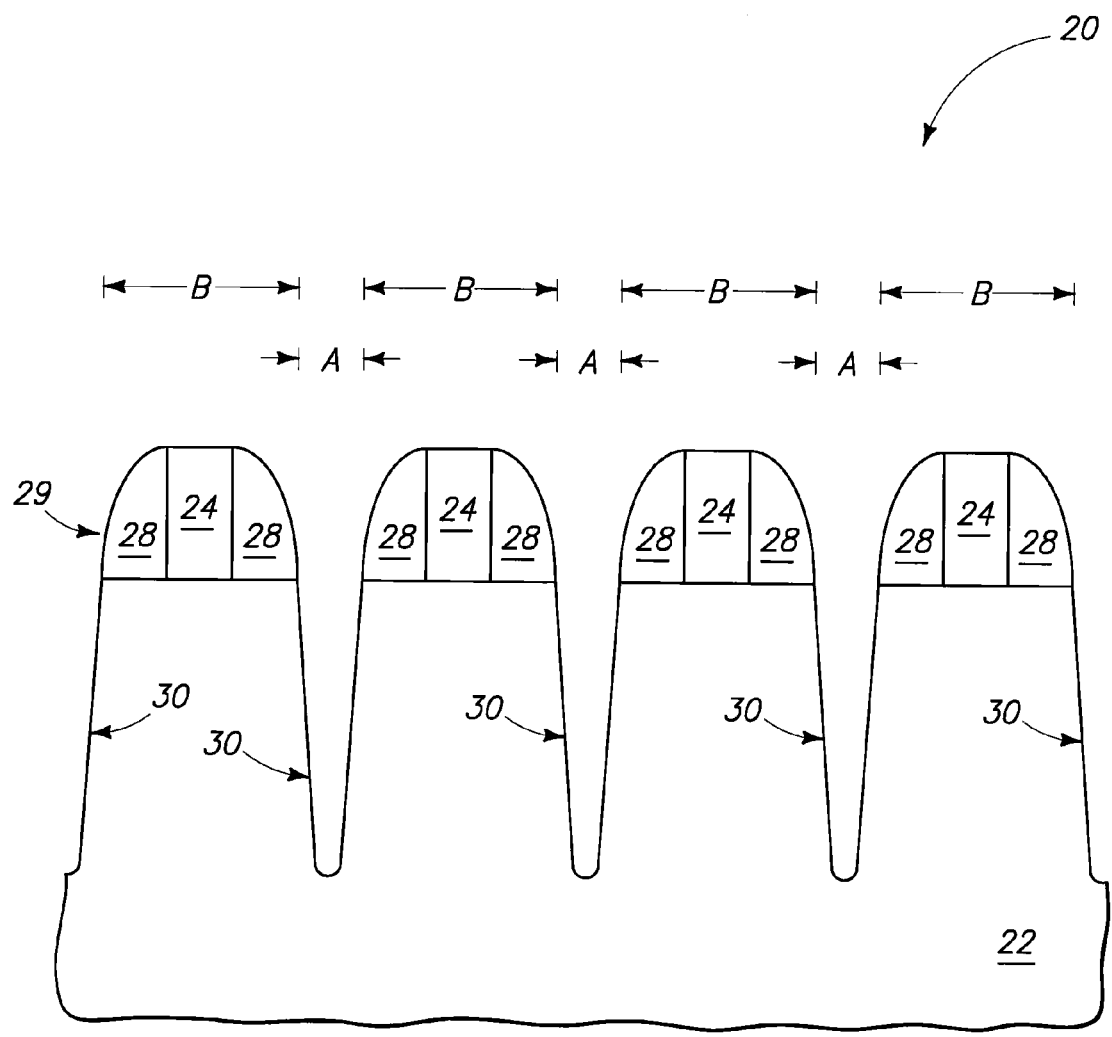
FIG. 6 is a view of the FIG. 2 substrate fragment after processing subsequent to that shown by FIG. 5.

Referring to FIG. 6, first trench lines 30 have been etched into semiconductive material of semiconductor substrate 22 using mask lines 24 and sidewall spacers 28 as a first etching mask. FIG. 6 depicts trenches 30 as having inwardly tapering widths along their depths due to typical artifact in trench etching, although other profiles, for example more vertically oriented sidewalls, might also be achieved. Regardless, first trench lines 30 might be considered as having respective maximum open widths "A" within the semiconductive material of substrate 22. Such open widths A may be the same or different across the substrate. Further for purposes of the continuing discussion, semiconductive material of the substrate might be considered between adjacent first line trenches 30 as having respective minimum widths "B". Such widths B may be the same or different across the substrate. In some embodiments, for example in overcoming the above-identified problem which motivated the invention, maximum open width's A are no greater than 35 nanometers. Further by way of example only, an example depth range for isolation trenches 30 within the semiconductive material of substrate 22 where electrical isolation is desired is from 100 to 500 nanometers.

Further and more broadly considered, the above describes example embodiments of etching first trench lines into semiconductive material of a semiconductor substrate. Any alternate process as just so stated is also contemplated, whether existing or yet-to-be developed, and regardless of whether using a first etching mask as described above on or over the substrate, whether using no mask, or whether using an alternate mask to that shown and described.

Referring to FIG. 7, first isolation material 32 has been formed within first trench lines 30 within the semiconductive material of substrate 22. Such might comprise one or more different composition materials, with high density plasma-deposited silicon dioxide being but one specific example. Regardless, one or more isolation materials 32 might be deposited over the substrate blanketly and/or perhaps grown selectively or otherwise from within trenches 30 in material 22. First isolation material 32 in FIG. 7 is shown as having been deposited to within and overfilling first trench lines 30 within semiconductive material of substrate 22 to be received between adjacent of the sidewall spacers 28 and to be received elevationally over mask lines 24. However, first isolation material 32 may or may not overfill trench lines 30. In one embodiment, and as shown. the respective second sidewall spacer edges referred to above are in physical touching contact with the first isolation material.

Figure 8:
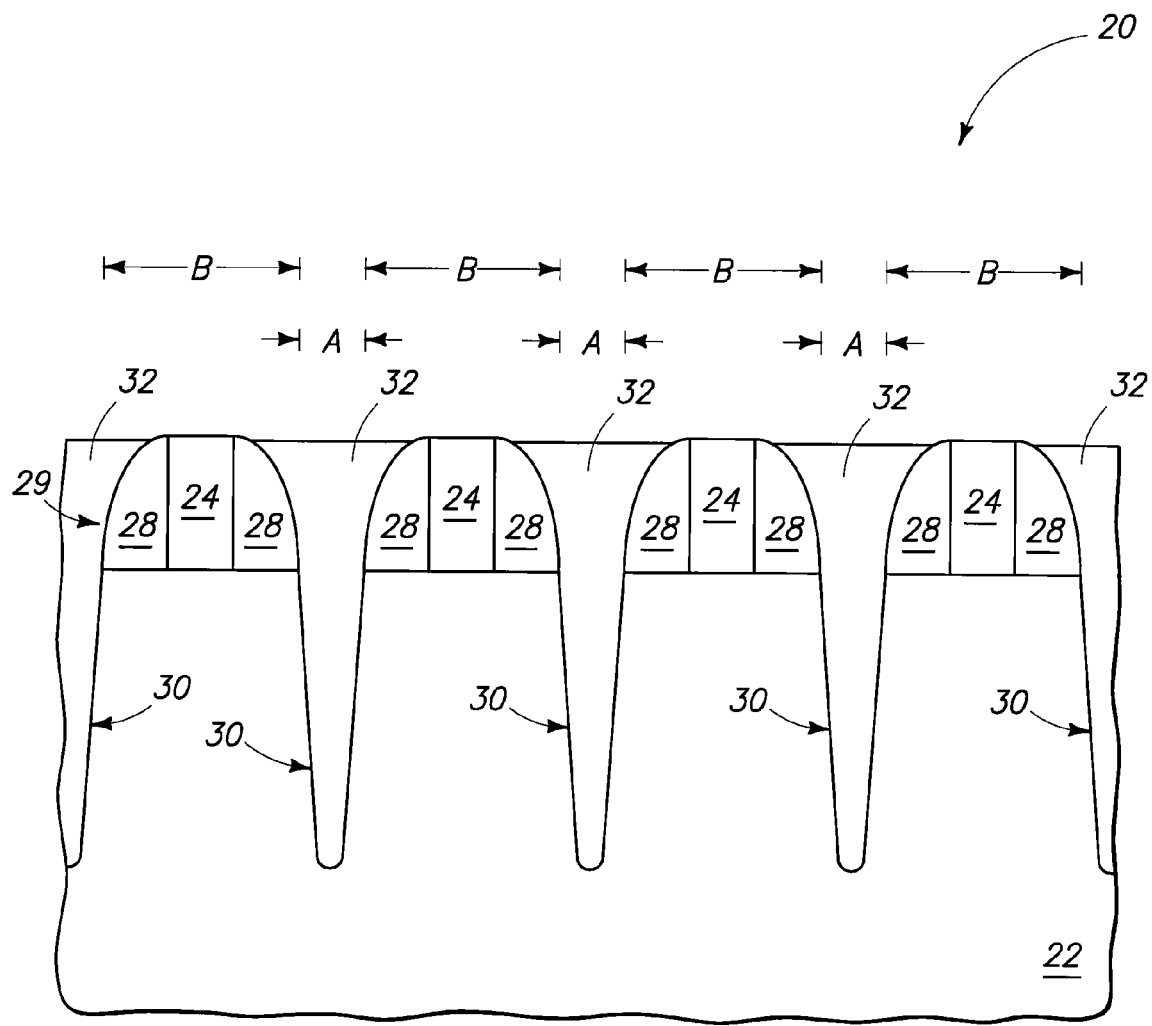
FIG. 8 is a view of the FIG. 2 substrate fragment after processing subsequent to that shown by FIG. 7.

Referring to FIG. 8, first isolation material 32 has been removed effective to expose mask lines 24. Such is also depicted as exposing sidewall spacers 28. Example manners of removing material 32 include masked or maskless timed etch back, resist etch back, and mechanical and/or chemical mechanical polishing. FIG. 8 depicts some of material 32 being received elevationally outward of substrate material 22 between sidewall spacers 28. Alternately and by way of example only, material 32 might be removed at least to the outermost surface of substrate material 22, and perhaps to further below such outer surface to within first trench lines 30.

Figure 9:
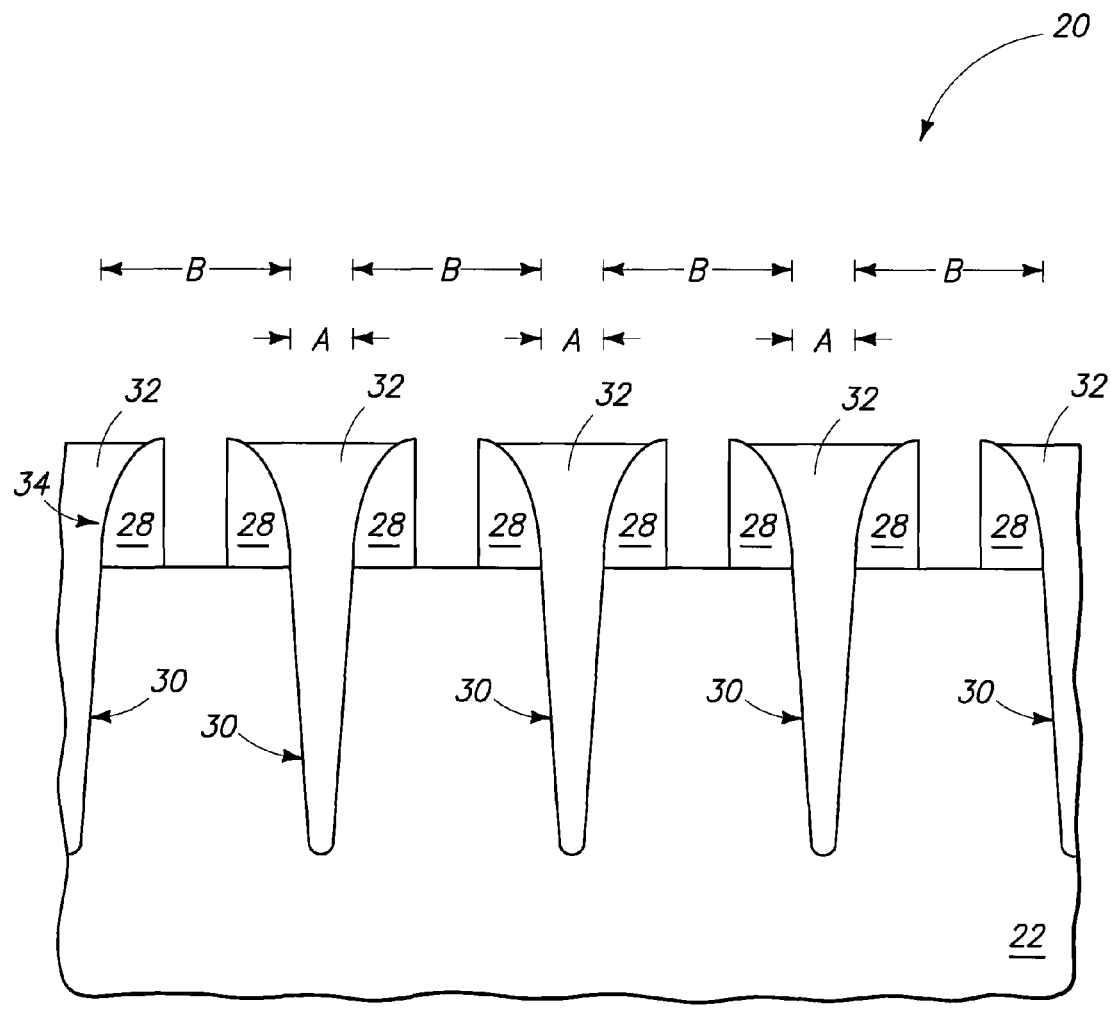
FIG. 9 is a view of the FIG. 2 substrate fragment after processing subsequent to that shown by FIG. 8.

Referring to FIG. 9, the material of mask lines 24 (not shown) has been etched from substrate 20 selectively relative to sidewall spacers 28. In one embodiment, such defines a second etching mask 34 comprising sidewall spacers 28 and first isolation material 32 received within first trench line 30.

Figure 10:
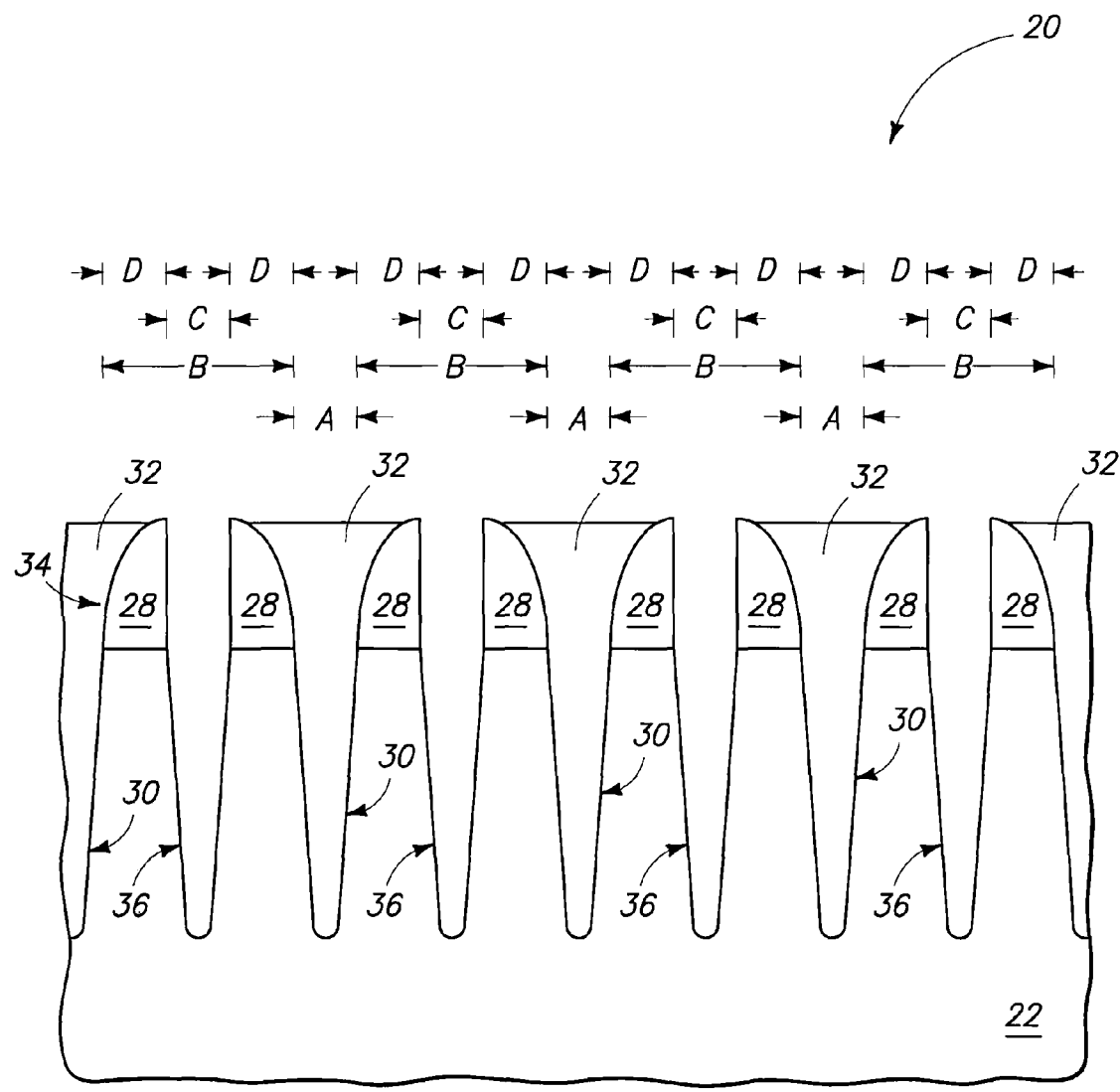
FIG. 10 is a view of the FIG. 2 substrate fragment after processing subsequent to that shown by FIG. 9.

Referring to FIG. 10, second trench lines 36 have been etched into semiconductive material of substrate 22 using sidewall spacers 28 and first isolation material 32 within first trench lines 30 as a second etching mask 34. In one embodiment and as shown, first trench lines 30 and second trench lines 36 alternate across at least some portion of substrate 20. Second trench lines 36, analogous to the fabrication of first trench lines 30, are shown as having inwardly tapering widths along their depths, although alternate configurations are also of course contemplated, Regardless, second trench lines 36 may be considered as having respective maximum open widths "C " within a semiconductive material of substrate 22. Such maximum open widths C may be the same or different across the substrate. Further, semiconductive material of substrate 22 between adjacent of the first and second trench lines may be considered as having respective minimum widths "D". Such minimum widths D may be the same or different across the substrate. In some embodiments, dimensions C are no greater than 35 nanometers, and in some embodiments dimensions D are no greater than 35 nanometers, for example where the problem identified above which motivated some embodiments of the invention manifested. In one embodiment and as shown, the etching of the second trench lines occurs while the first isolation trench material is received between sidewall spacers 28. In one embodiment and as shown, the respective second sidewall spacer edges referred to above are in physical touching contact with the first isolation material during the etching of the second trench lines into the semiconductive material. Further, the respective first sidewall spacer edges are laterally exposed during the etching of the second trench lines into the semiconductive material.

Figure 11:
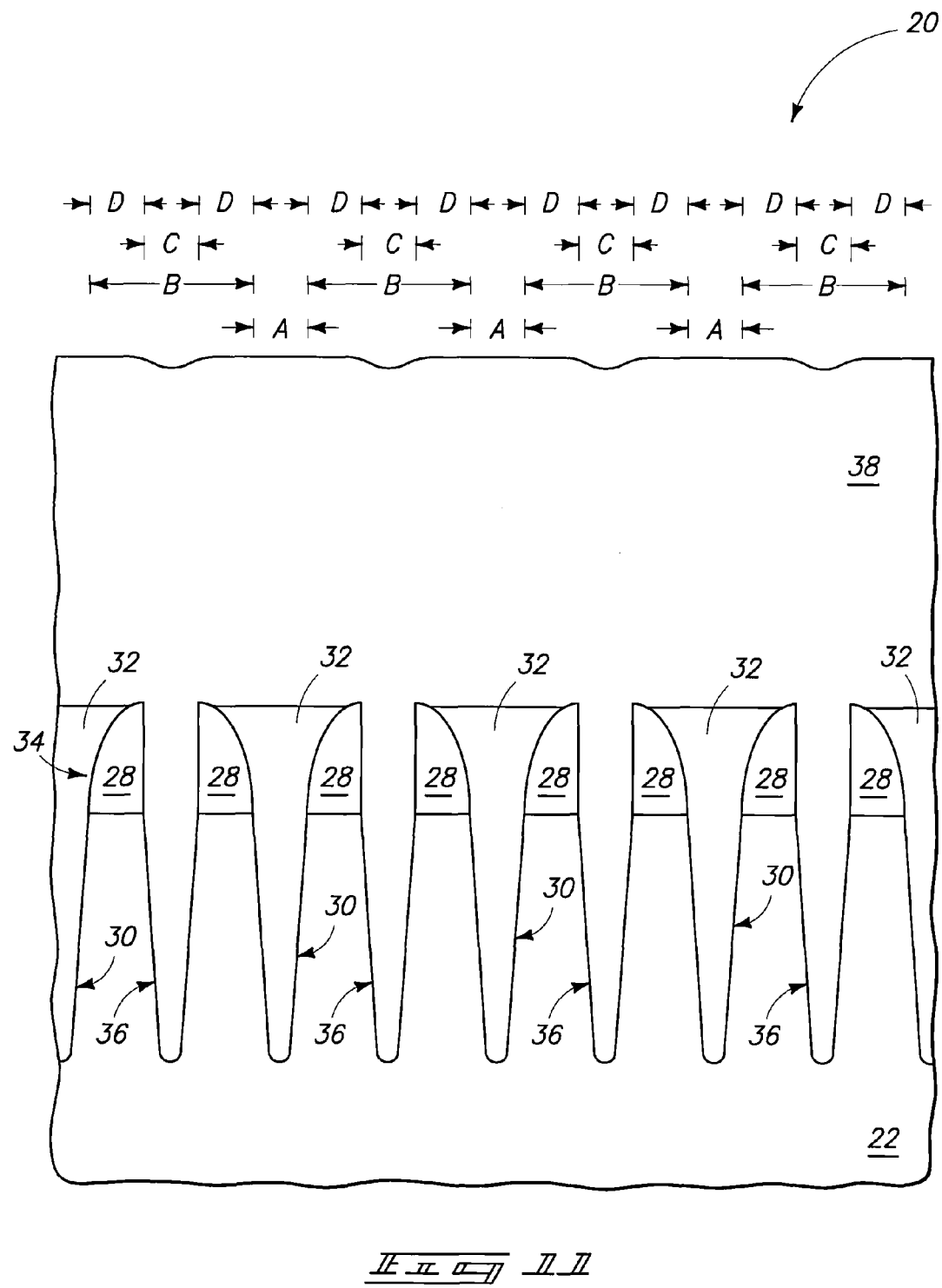
FIG. 11 is a view of the FIG. 2 substrate fragment after processing subsequent to that shown by FIG. 10.

Referring to FIG. 11, second isolation material 38 has been formed within second trench lines 36 within semiconductive material of substrate 22. Such may be the same or different in composition from first isolation material 32, and regardless may be comprised of multiple different materials, and may or may not overfill second trench lines 36. Such is depicted in FIG. 11 as having been deposited to within and overfilling second line trenches 36. Alternately by way of example only, selective or other deposition might occur of material within second trench lines 36 selectively or otherwise. In one embodiment, the sidewall spacers are removed from the substrate, for example after etching the mask lines from the substrate, and in one embodiment after depositing the second isolation material. Regardless, in one embodiment where the first and second isolation materials overfill the first and second trench lines, respectively, within the semiconductive material, such overfilled first and second isolation materials may be removed back at least to semiconductive material of substrate 22.

Figure 12:
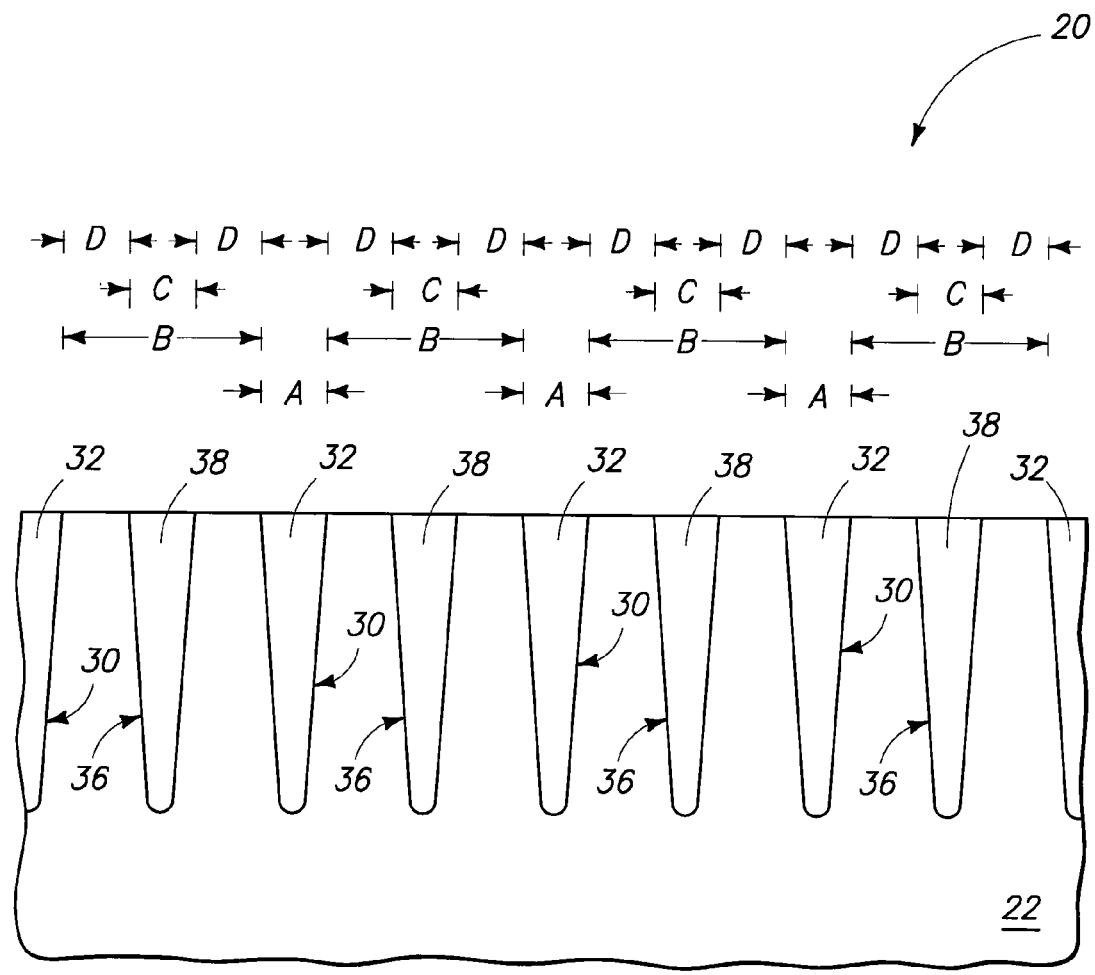
FIG. 12 is a view of the FIG. 2 substrate fragment after processing subsequent to that shown by FIG. 11.

FIG. 12 depicts but one example embodiment wherein sidewall spacers 28 (not shown), overfilled first isolation material 32 received outwardly of semiconductive material of substrate 22 (not shown), and overfilled second isolation material 36 received outwardly of semiconductive material of substrate 22 (not shown) have been removed, for example by polishing and/or etching action at least to semiconductive material of substrate 22. Such might occur by one or more different chemistry etch back techniques, or for example in one embodiment by chemical mechanical polishing (CMP). Alternately and by way of example only, some of materials 28, 32, and/or 36 might remain outwardly of trenches 30 and 36 within substrate material 22.

Splitting the trench etch and fill into at least two parts, for example as described above, may in some embodiments address and/or overcome the problem identified in the "Background" section above. For example, the structures may be less susceptible to bending during fill due to a wider expanse of material between adjacent empty trenches.

The above example depicted and described embodiments are but only example methods of forming trench isolation. Such was depicted as using a pitch multiplication technique, although no multiplication technique, and alternate techniques whether existing or yet-to-be developed might of course be used.

For example in accordance with one embodiment, a method of forming trench isolation includes etching first trench lines into semiconductive material of a semiconductor substrate regardless of using a mask. First isolation material is formed within the first trench lines within the semiconductive material of the substrate. After forming such first isolation material within the first trench lines, second trench lines are etched into semiconductive material of the substrate between the first trench lines such that the first trench lines and the second trench lines alternate. For example and by way of example only, FIG. 12 depicts first trench lines 30 which alternate with second trench lines 36. Second isolation material is formed within the second trench lines within the semiconductive material. Accordingly, an embodiment of the invention encompasses breadth as just so stated without limiting reference to the drawings or other sections of this document.

In one embodiment, the etching of the second trench lines forms the semiconductive material between adjacent first and second trench lines to have respective minimum widths which are no greater than 35 nanometers. In one embodiment, the first isolation material is formed to overfill the first trench lines within the semiconductive material and the second isolation material is formed to overfill the second trench lines within the semiconductive material. Where such occurs, in one embodiment both the first isolation material which overfills the first trench lines and the second isolation material which overfills the second trench lines are removed back at least to an outermost surface of the semiconductive material. Further and regardless, in one embodiment both gate dielectric material is formed over the semiconductive material and floating gate material is formed over the gate dielectric material prior to etching of the first trench lines. Such is described, by way of one example only, in an embodiment below.

In some embodiments of the invention, a method of forming trench isolation comprises etching first trench lines into semiconductive material of a semiconductor substrate. The first trench lines have respective maximum open widths within the semiconductive material of no greater than 35 nanometers. The semiconductive material between adjacent first trench lines has respective minimum widths which are at least twice that of the respective maximum open widths of the first trench lines. In one embodiment, the etching of the first trench lines forms the semiconductive material between adjacent first trench lines to have respect minimum widths which are about twice that of such respective maximum open widths of the first trench lines. Regardless, the first trench lines within the semiconductive material are filled.

After filling the first trench lines, second trench lines are etched into semiconductive material of the semiconductor substrate between the first trench lines such that the first and second trench lines alternate. The second trench lines have respective maximum open widths within the semiconductive material which are no greater than 35 nanometers. The semiconductive material between adjacent first and second trench lines has respective minimum widths which are no greater than 35 nanometers. The second trench lines within the semiconductive materials are filled.

In some embodiments, the first and second trench lines are filled by deposition of one or more insulative materials to within the first and second trench lines, and in some embodiments such are overfilled with insulative material. In some embodiments, after filling the second trench lines, the insulative material is removed by polishing or etching at least to the semiconductive material of the substrate.

Further in some embodiments wherein etching the first trench lines is conducted using a first mask and etching of the second trench lines is conducted using a second mask, the second mask comprises part of the first mask, with the second mask being formed at least in part by etching only a portion of the first mask away from the substrate. The above depicted embodiment is, by way of example only, one such example implementation.

Figure 13:
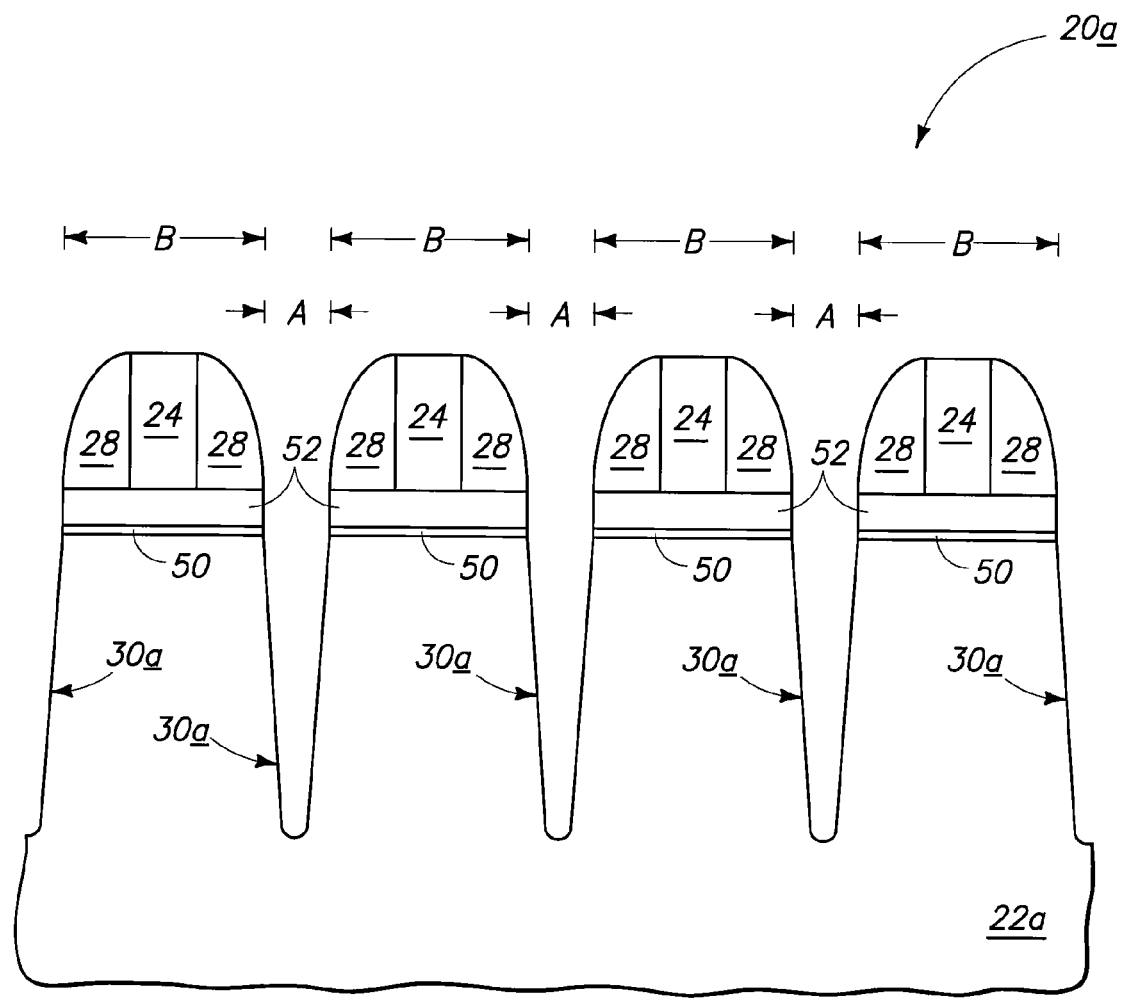
FIG. 13 is a diagrammatic sectional view of a semiconductor substrate fragment in process in accordance with an embodiment of the invention.

Embodiments of the invention might be used to fabricate any existing or yet-to-be developed integrated circuitry. In one example embodiment, methods can be used to form floating gate transistors. By way of example only, an example embodiment is described in connection with FIGS. 13-16 in conjunction with a substrate fragment 20a. Like numerals from the first-described embodiment are utilized where appropriate, with differences being indicated with different numerals or with the suffix "a". FIG. 13 depicts substrate fragment 20a corresponding in process sequence to that of substrate 20 of FIG. 6. Semiconductor substrate 20a comprises one or more materials 22a comprising semiconductive material. For example and by way of example only, material 22a might comprise bulk monocrystalline silicon, or alternately by way of example only some semiconductor-on-insulator substrate. A first gate dielectric material 50 has been formed over semiconductive material of semiconductor substrate 22a. For example, first gate dielectric material 50 might comprise silicon dioxide, silicon nitride, a combination of silicon oxide and silicon nitride, or one or more other suitable gate dielectric materials. A floating gate material 52 has been formed over first gate dielectric material 50. An example floating gate material comprises conductively doped polysilicon. Mask lines 24 and sidewall spacers 28 have been formed over floating gate material 52. First trench lines 30a have been etched into floating gate material 52, gate dielectric material 50, and semiconductive material of semiconductor substrate 22a between the sidewall spacers using mask lines 24 and sidewall spacers 28 as a first etching mask. Alternate or additional processing as described above might also of course be utilized.

Figure 14:
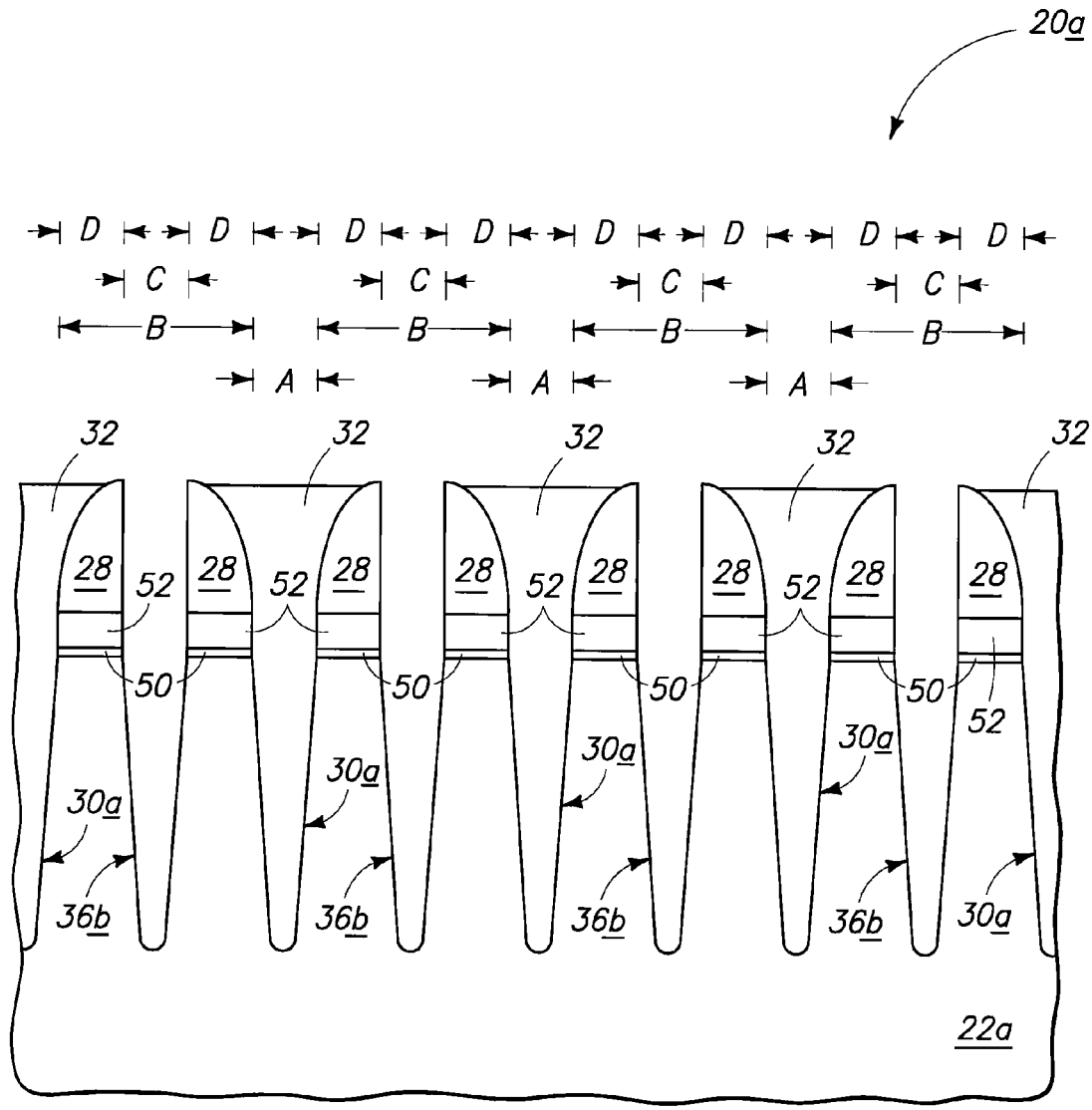
FIG. 14 is a view of the FIG. 13 substrate fragment after processing subsequent to that shown by FIG. 13.

FIG. 14 corresponds in processing sequence to FIG. 10 of the first described embodiments. First isolation material 32 has been formed within first trench lines 30a, and mask lines 24 (not shown) have been etched from the substrate selectively relative to sidewall spacers 28. Second trench lines 36b have been etched into floating gate material 52, first gate dielectric material 50, and semiconductive material of semiconductor substrate 22a using sidewall spacers 28 and first isolation material 32 within first trench lines 30a as a second etching mask.

Figure 15:
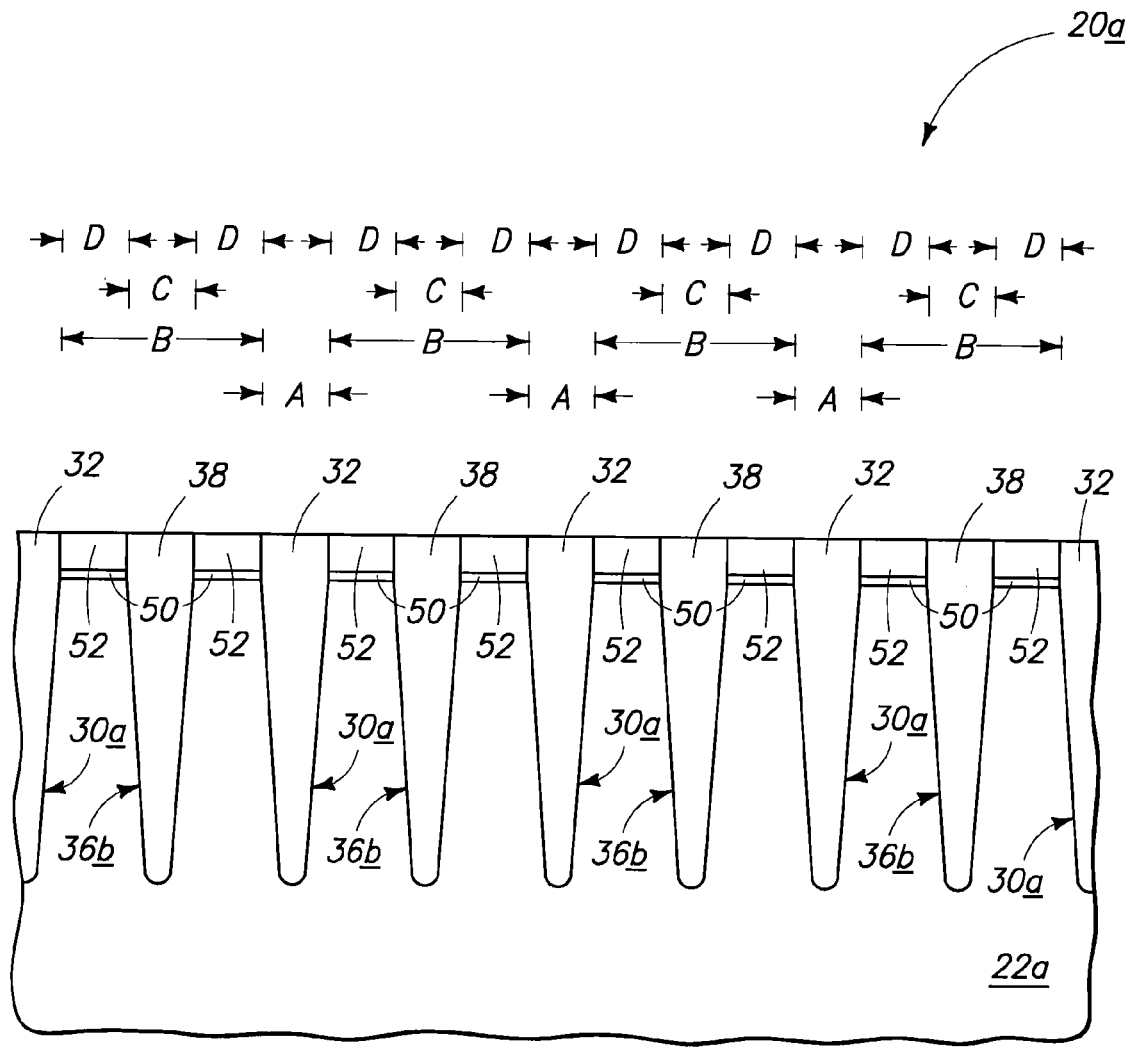
FIG. 15 is a view of the FIG. 13 substrate fragment after processing subsequent to that shown by FIG. 14.

FIG. 15 corresponds in processing sequence to that of FIG. 12 of the first described embodiments. Second isolation material 38 has been formed within second trench lines 36b within the semiconductive material of semiconductor substrate 22a. Sidewall spacers 28 (not shown) have been removed from the substrate after etching to form second trench lines 36b, and in one embodiment after forming second trench isolation material 38 within second trench lines 36b. In one example, where for example the first isolation material within the first trench lines is formed to overfill the first trench lines and where forming the second isolation material within the second trench lines overfills the second trench lines, one embodiment comprises removing the first isolation material, the second isolation material, and the spacers by polishing and/or etching at least to the semiconductive material of semiconductor substrate 22a.

Figure 16:
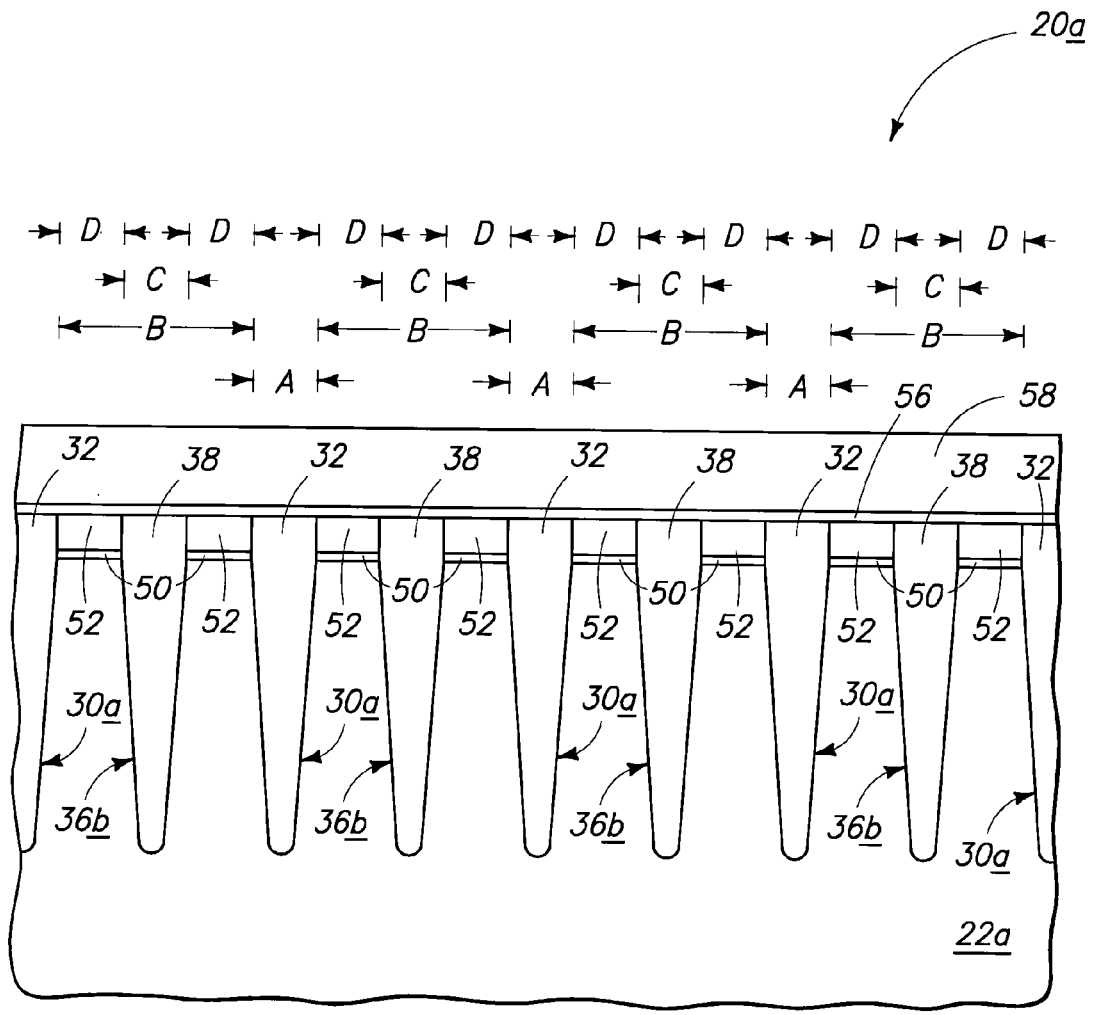
FIG. 16 is a view of the FIG. 13 substrate fragment after processing subsequent to that shown by FIG. 15.

Referring to FIG. 16, a second gate dielectric material 56 has been formed over floating gate material 52. Such might comprise one or more different materials, and may be the same as or different from first gate dielectric material 50. A control gate material 58 has been formed over second gate dielectric material 56. Such can be patterned or otherwise processed as desired to form suitable control gate lines for the floating gate transistors, and source/drain regions provided for such transistors using either existing or yet-to-be developed techniques.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming trench isolation, comprising:
   forming mask lines over a semiconductor substrate;
   forming sidewall spacers laterally over sidewalls of the mask lines, the sidewall spacers respectively having a first sidewall spacer edge in physical touching contact with one of the sidewalls of the mask lines and a second sidewall spacer edge opposite the first sidewall spacer edge, the second sidewall spacer edge not being in physical touching contact with any sidewall of the mask lines;
   etching first trench lines into semiconductive material of the semiconductor substrate between the sidewall spacers using the mask lines and sidewall spacers as a first etching mask;
   depositing first isolation material to within and overfilling the first trench lines within the semiconductive material to be received between adjacent of the sidewall spacers and to be received elevationally over the mask lines and sidewall spacers, the second sidewall spacer edge being in physical touching contact with the first isolation material;
   removing the first isolation material effective to expose the mask lines;
   after the removing, etching the mask lines from the substrate selectively relative to the sidewall spacers;
   after etching the mask lines from the substrate, etching second trench lines into semiconductive material of the semiconductor substrate using the sidewall spacers and the first isolation material within the first trench lines as a second etching mask, the second sidewall spacer edge being in physical touching contact with the first isolation material during the etching of the second trench lines into the semiconductive material, the first sidewall spacer edge being laterally exposed during the etching of the second trench lines into the semiconductive material;
   depositing second isolation material to within and overfilling the second trench lines within the semiconductive material; and
   removing the sidewall spacers from the substrate after the etching of the second trench lines into the semiconductive material.

2. The method of claim 1 comprising removing the sidewall spacers from the substrate after depositing the second isolation material.

3. The method of claim 1 comprising removing the overfilled second isolation material and the overfilled first isolation material back at least to the semiconductive material.

4. The method of claim 3 comprising removing the sidewall spacers from the substrate after depositing the second isolation material; the removing of the overfilled second isolation material, the overfilled first isolation material, and the sidewall spacers comprising polishing.

5. The method of claim 1 wherein the first trench lines are etched to a uniform depth within the semiconductive material, and the second trench lines are etched to a uniform depth within the semiconductive material which is the same as the uniform depth of the first trench lines within the semiconductive material.

6. A method of forming floating gate transistors, comprising:
  forming floating gate material over first gate dielectric material over semiconductive material of a semiconductor substrate;
  forming mask lines over the floating gate material;
  forming sidewall spacers laterally over sidewalls of the mask lines, the sidewall spacers respectively having a first sidewall spacer edge in physical touching contact with one of the sidewalls of the mask lines and a second sidewall spacer edge opposite the first sidewall spacer edge, the second sidewall spacer edge not being in physical touching contact with any sidewall of the mask lines;
  etching first trench lines into the floating gate material, the first gate dielectric material, and the semiconductive material of the semiconductor substrate between the sidewall spacers using the mask lines and sidewall spacers as a first etching mask;
  forming first isolation material within the first trench lines within the semiconductive material, the second sidewall spacer edge being in physical touching contact with the first isolation material;
  after forming the first isolation material within the first trench lines, etching the mask lines from the substrate selectively relative to the sidewall spacers;
  after etching the mask lines from the substrate, etching second trench lines into the floating gate material, the gate first dielectric material, and the semiconductive material of the semiconductor substrate using the sidewall spacers and the first isolation material within the first trench lines as a second etching mask, the second sidewall spacer edge being in physical touching contact with the first isolation material during the etching of the second trench lines into the semiconductive material, the first sidewall spacer edge being laterally exposed during the etching of the second trench lines into the semiconductive material;
  forming second isolation material within the second trench lines within the semiconductive material; and
  after forming the second isolation material with the second trench lines, forming second gate dielectric material over the floating gate material and forming control gate material over the second gate dielectric material.

7. The method of claim 6 comprising removing the sidewall spacers from the substrate at a point in time after etching the second trench lines.

8. The method of claim 7 wherein the point in time is also after forming the second isolation material within the second trench lines.

9. The method of claim 6 wherein forming the first isolation material within the first trench lines overfills the first trench lines, and forming the second isolation material within the second trench lines overfills the second trench lines; and further comprising removing the first isolation material, the second isolation material, and the spacers by polishing or etching at least to the semiconductive material of the substrate.

10. The method of claim 6 wherein the first trench lines are etched to a uniform depth within the semiconductive material, and the second trench lines are etched to a uniform depth within the semiconductive material which is the same as the uniform depth of the first trench lines within the semiconductive material.

11. A method of forming floating gate transistors, comprising:
  forming floating gate material over first gate dielectric material over semiconductive material of a semiconductor substrate;
  forming mask lines over the floating gate material;
  forming sidewall spacers on sidewalls of the mask lines;
  etching first trench lines into the floating gate material, the first gate dielectric material, and the semiconductive material of the semiconductor substrate between the sidewall spacers using the mask lines and sidewall spacers as a first etching mask, the first trench lines being etched to a uniform depth within the semiconductive material;
  forming first isolation material within the first trench lines within the semiconductive material;
  after forming the first isolation material within the first trench lines, etching the mask lines from the substrate selectively relative to the sidewall spacers;
  after etching the mask lines from the substrate, etching second trench lines into the floating gate material, the gate first dielectric material, and the semiconductive material of the semiconductor substrate using the sidewall spacers and the first isolation material within the first trench lines as a second etching mask, the second trench lines being etched to a uniform depth within the semiconductive material which is the same as the uniform depth of the first trench lines within the semiconductive material;
  forming second isolation material within the second trench lines within the semiconductive material;
  the forming of the first isolation material within the first trench lines overfilling the first trench lines, and the forming of the second isolation material within the second trench lines overfilling the second trench lines;
  removing the first isolation material and the second isolation material by polishing or etching to form the first isolation material, the second isolation material, and the floating gate material to have respective elevationally outermost surfaces which are coplanar relative to one another;
  removing all of the sidewall spacers from the substrate; and
  after the removing of the first isolation material and the second isolation material, forming second gate dielectric material over the floating gate material and forming control gate material over the second gate dielectric material.

12. The method of claim 11 wherein the sidewall spacers are removed after forming the second isolation material.

13. The method of claim 12 wherein the sidewall spacers are removed during said removing of the first isolation material and the second isolation material by polishing or etching.

14. The method of claim 11 wherein said removing of the first isolation material, the second isolation material, and the sidewall spacers is by polishing.

15. The method of claim 11 wherein said removing of the first isolation material, the second isolation material, and the sidewall spacers is by polishing.

16. The method of claim 11 wherein the etching of the second trench lines forms the floating gate material, the first gate dielectric material, and the semiconductive material between adjacent first and second trench lines to have respective minimum widths which are no greater than 35 nanometers.

17. The method of claim 11 wherein the first trench lines have respective maximum open widths within the floating gate material, the first gate dielectric material, and the semiconductive material between adjacent first trench lines; the etching of the first trench lines forming the floating gate material, the first gate dielectric material, and the semiconductive material between adjacent first trench lines to have respective minimum widths which are about twice that of said respective maximum open widths of the first trench lines.

18. The method of claim 17 wherein the respective minimum widths are no greater than 35 nanometers.

* * * * *